(12) United States Patent
Chen

(10) Patent No.: US 12,408,500 B2
(45) Date of Patent: Sep. 2, 2025

(54) LIGHT-EMITTING MODULE AND DISPLAY DEVICE

(71) Applicant: GUANGZHOU CHINA STAR OPTOELECTRONICS SEMICONDUCTOR DISPLAY TECHNOLOGY CO., LTD., Guangdong (CN)

(72) Inventor: Paijie Chen, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/756,659

(22) PCT Filed: May 16, 2022

(86) PCT No.: PCT/CN2022/093057
§ 371 (c)(1),
(2) Date: May 30, 2022

(87) PCT Pub. No.: WO2023/201803
PCT Pub. Date: Oct. 26, 2023

(65) Prior Publication Data
US 2024/0162387 A1 May 16, 2024

(30) Foreign Application Priority Data
Apr. 19, 2022 (CN) .......................... 202210410863.0

(51) Int. Cl.
*H10H 20/856* (2025.01)
*H01L 25/075* (2006.01)
*H10H 20/841* (2025.01)

(52) U.S. Cl.
CPC ....... *H10H 20/856* (2025.01); *H01L 25/0753* (2013.01); *H10H 20/841* (2025.01)

(58) Field of Classification Search
None
See application file for complete search history.

(56) References Cited

U.S. PATENT DOCUMENTS

2005/0083454 A1   4/2005  Sumi
2017/0133357 A1*  5/2017  Kuo ...................... H10H 20/85
(Continued)

FOREIGN PATENT DOCUMENTS

CN   101136341 A   3/2008
CN   110174789 A   8/2019
(Continued)

OTHER PUBLICATIONS

International Search Report in International application No. PCT/CN2022/093057, mailed on Nov. 25, 2022.
(Continued)

*Primary Examiner* — Feifei Yeung Lopez
(74) *Attorney, Agent, or Firm* — PV IP PC; Wei Te Chung

(57) ABSTRACT

A light-emitting module and a display device are provided. Reflective units are disposed, which include a main body disposed on a backplate and a reflective part disposed on the main body. The main body is provided with a retaining wall structure on one side away from the backplate, and an orthographic projection of the reflective part on the backplate covers an orthographic projection of the main body on the backplate, thereby effectively blocking a flow of a material of the reflective part, thereby controlling a height of the reflective part.

16 Claims, 4 Drawing Sheets

(56) References Cited

U.S. PATENT DOCUMENTS

2020/0175243 A1    6/2020    Liu et al.
2022/0005791 A1*    1/2022    Yu .................... H10D 84/8316

FOREIGN PATENT DOCUMENTS

| | | |
|---|---|---|
| CN | 111128008 A | 5/2020 |
| CN | 112259006 A | 1/2021 |
| CN | 112596303 A | 4/2021 |
| CN | 112652247 A | 4/2021 |
| CN | 112786766 A | 5/2021 |
| CN | 112882282 A | 6/2021 |
| CN | 214704248 U | 11/2021 |
| CN | 113809142 A | 12/2021 |
| CN | 113985656 A | 1/2022 |
| CN | 114038840 A | 2/2022 |
| CN | 114280847 A | 4/2022 |
| JP | 2007298627 A | 11/2007 |
| JP | 2007324235 A | 12/2007 |

OTHER PUBLICATIONS

Written Opinion of the International Search Authority in International application No. PCT/CN2022/093057, mailed on Nov. 25, 2022.
Chinese Office Action issued in corresponding Chinese Patent Application No. 202210410863.0 dated Nov. 21, 2022, pp. 1-7.

* cited by examiner

LIGHT-EMITTING MODULE AND DISPLAY DEVICE

FIELD OF INVENTION

The present disclosure relates to the field of display technologies, and more particularly, to a light-emitting module and a display device.

BACKGROUND OF INVENTION

In mini-light-emitting diode (mini-LED) displays, a large number of densely distribution is usually used to realize dimming in a small area. Therefore, under the premise of small light-mixing distances, they can still achieve good brightness uniformity, and pictures are colorful and have higher contrast. With high color gamut configuration, effects thereof can be comparable to organic light-emitting diodes (OLEDs). Meanwhile, an existence of a large number of dense light sources is easier to achieve higher brightness requirements than conventional LED displays. At present, in view of many advantages of mini-LED displays, the mini-LED displays have significant advantages in applications of ultra-thin, high color rendering, and power saving, and have received extensive attention from major manufacturers.

Conventional mini-LED light-emitting modules usually include reflective coating layers. The reflective coating layers are provided with windows, and mini-light-emitting diodes are disposed in the windows. The reflective coating layers can effectively reflect light emitted from lateral sides of the mini-light-emitting diodes to a light-emitting surface of the light-emitting modules to improve emitting efficiency of the light. However, the reflective coating layers usually use white oil material that has fluidity. Therefore, in practical manufacturing processes, a height of the reflective coating layers cannot be effectively controlled, thereby causing problems such as difficulty in fabrication processes and inability to effectively reflect the light emitted from the lateral sides of the mini-light-emitting diodes to the light-emitting surface of the light-emitting modules.

Technical problem: an embodiment of the present disclosure provides a light-emitting module and a display device to solve deficiencies in related technologies.

SUMMARY OF INVENTION

In order to solve the above technical problems, the embodiments of the present disclosure provide technical solutions as follows.

An embodiment of the present disclosure provides a light-emitting module, which includes:
  a backplate;
  a plurality of light-emitting units disposed on the backplate; and
  a reflective layer disposed on the backplate and including a plurality of reflective units, wherein, one of the reflective units surrounds one of the light-emitting units, and the reflective units include a reflective surface on one side away from the backplate;
  wherein, in one light-emitting unit and one reflective unit corresponding to the light-emitting unit, a height of the reflective surface is gradually increased along a direction away from the light-emitting unit; and
  the reflective unit includes a main body disposed on the backplate and a reflective part disposed on the main body, the reflective surface is located on one side of the reflective part away from the main body, the main body is provided with a retaining wall structure on one side away from the backplate, and an orthographic projection of the reflective part on the backplate covers an orthographic projection of the main body on the backplate.

In the light-emitting module provided in the embodiment of the present disclosure, in the reflective unit and the light-emitting unit corresponding to the reflective unit, a height of the main body is gradually increased along the direction away from the light-emitting unit.

In the light-emitting module provided in the embodiment of the present disclosure, in the reflective unit and the light-emitting unit corresponding to the reflective unit, the main body includes a plurality of raised parts disposed in sequence away from the light-emitting unit, and heights of the raised parts are gradually increased along the direction away from the light-emitting unit.

In the light-emitting module provided in the embodiment of the present disclosure, the main body at least includes a first raised part and a second raised part disposed in sequence away from the light-emitting unit; and
  the second raised part includes a raised main part and the retaining wall structure disposed in a stack, a height of the raised main part is greater than a height of the first raised part, and an orthographic projection of the retaining wall structure in a direction perpendicular to the backplate is within an orthographic projection of the first raised part in the direction perpendicular to the backplate.

In the light-emitting module provided in the embodiment of the present disclosure, the main body at least includes a first raised part and a second raised part disposed in sequence away from the light-emitting unit, and an orthographic projection of the first raised part on the backplate and an orthographic projection of the second raised part on the backplate do not overlap; and
  the retaining wall structure is located on one side of the second raised part away from the backplate, and an orthographic projection of the retaining wall structure in a direction perpendicular to the backplate is within an orthographic projection of the second raised part in the direction perpendicular to the backplate.

In the light-emitting module provided in the embodiment of the present disclosure, orthographic projections of adjacent raised parts on the backplate do not overlap;
  the retaining wall structure includes a plurality of retaining walls, and one of the retaining walls corresponds to one of the raised parts; and
  in a direction perpendicular to the backplate, heights of adjacent retaining walls are equal.

In the light-emitting module provided in the embodiment of the present disclosure, in the direction away from the light-emitting unit, gaps between the adjacent retaining walls are equal or are gradually increased.

In the light-emitting module provided in the embodiment of the present disclosure, in the reflective unit and the light-emitting unit corresponding to the reflective unit, the main body includes a raised part, and the raised part includes a raised beveled surface on one side away from the backplate; and
  in the reflective unit and the light-emitting unit corresponding to the reflective unit, a height of the raised part is gradually increased along the direction away from the light-emitting unit, the retaining wall structure includes a plurality of retaining walls disposed on the raised beveled surface and surrounding the light-emitting unit, and the retaining walls are arranged in sequence along a direction from the reflective unit to the light-emitting unit.

In the light-emitting module provided in the embodiment of the present disclosure, in a direction perpendicular to the backplate, in any two of the retaining walls, a distance from one of the retaining walls away from the light-emitting unit to the backplate is greater than a distance from another one of the retaining walls adjacent to the light-emitting unit to the backplate.

In the light-emitting module provided in the embodiment of the present disclosure, an included angle between a tangent line of any point on the reflective surface and the backplate is greater than or equal to 60 degrees.

An embodiment of the present disclosure provides a display device, which includes a display panel and a light-emitting module, wherein the display panel includes a display area and a non-display area adjacent to the display area, and the light-emitting module is disposed corresponding to the display area and includes:

a backplate;
a plurality of light-emitting units disposed on the backplate; and
a reflective layer disposed on the backplate and including a plurality of reflective units, wherein, one of the reflective units surrounds one of the light-emitting units, and the reflective units include a reflective surface on one side away from the backplate;
wherein, in one light-emitting unit and one reflective unit corresponding to the light-emitting unit, a height of the reflective surface is gradually increased along a direction away from the light-emitting unit; and
the reflective unit includes a main body disposed on the backplate and a reflective part disposed on the main body, the reflective surface is located on one side of the reflective part away from the main body, the main body is provided with a retaining wall structure on one side away from the backplate, and an orthographic projection of the reflective part on the backplate covers an orthographic projection of the main body on the backplate.

In the display device provided in the embodiment of the present disclosure, in the reflective unit and the light-emitting unit corresponding to the reflective unit, a height of the main body is gradually increased along the direction away from the light-emitting unit.

In the display device provided in the embodiment of the present disclosure, in the reflective unit and the light-emitting unit corresponding to the reflective unit, the main body includes a plurality of raised parts disposed in sequence away from the light-emitting unit, and heights of the raised parts are gradually increased along the direction away from the light-emitting unit.

In the display device provided in the embodiment of the present disclosure, the main body at least includes a first raised part and a second raised part disposed in sequence away from the light-emitting unit; and the second raised part includes a raised main part and the retaining wall structure disposed in a stack, a height of the raised main part is greater than a height of the first raised part, and an orthographic projection of the retaining wall structure in a direction perpendicular to the backplate is within an orthographic projection of the first raised part in the direction perpendicular to the backplate.

In the display device provided in the embodiment of the present disclosure, the main body at least includes a first raised part and a second raised part disposed in sequence away from the light-emitting unit, and an orthographic projection of the first raised part on the backplate and an orthographic projection of the second raised part on the backplate do not overlap; and the retaining wall structure is located on one side of the second raised part away from the backplate, and an orthographic projection of the retaining wall structure in a direction perpendicular to the backplate is within an orthographic projection of the second raised part in the direction perpendicular to the backplate.

In the display device provided in the embodiment of the present disclosure, orthographic projections of adjacent raised parts on the backplate do not overlap;

the retaining wall structure includes a plurality of retaining walls, and one of the retaining walls corresponds to one of the raised parts; and in a direction perpendicular to the backplate, heights of adjacent retaining walls are equal.

In the display device provided in the embodiment of the present disclosure, in the direction away from the light-emitting unit, gaps between the adjacent retaining walls are equal or are gradually increased.

In the display device provided in the embodiment of the present disclosure, in the reflective unit and the light-emitting unit corresponding to the reflective unit, the main body includes a raised part, and the raised part includes a raised beveled surface on one side away from the backplate; and in the reflective unit and the light-emitting unit corresponding to the reflective unit, a height of the raised part is gradually increased along the direction away from the light-emitting unit, the retaining wall structure includes a plurality of retaining walls disposed on the raised beveled surface and surrounding the light-emitting unit, and the retaining walls are arranged in sequence along a direction from the reflective unit to the light-emitting unit.

In the display device provided in the embodiment of the present disclosure, in a direction perpendicular to the backplate, in any two of the retaining walls, a distance from one of the retaining walls away from the light-emitting unit to the backplate is greater than a distance from another one of the retaining walls adjacent to the light-emitting unit to the backplate.

In the display device provided in the embodiment of the present disclosure, an included angle between a tangent line of any point on the reflective surface and the backplate is greater than or equal to 60 degrees.

Beneficial effect: the embodiments of the present disclosure provide the light-emitting module and the display device. The light-emitting module includes the backplate and the plurality of light-emitting units and the reflective layer disposed on the backplate. The reflective layer includes the plurality of reflective units, one of the reflective units surrounds one of the light-emitting units, and the reflective units include a reflective surface on one side away from the backplate. In one light-emitting unit and one reflective unit corresponding to the light-emitting unit, the height of the reflective surface is gradually increased along the direction away from the light-emitting unit. The embodiments of the present disclosure dispose the reflective units, which include the main body disposed on the backplate and the reflective part disposed on the main body. One side of the main body away from the backplate includes the retaining wall structure, and the orthographic projection of the reflective part on the backplate covers the orthographic projection of the main body on the backplate, thereby effectively blocking a flow of a material of the reflective part, thereby controlling a height of the reflective part.

DESCRIPTION OF DRAWINGS

The following detailed description of specific embodiments of the present disclosure will make the technical solutions and other beneficial effects of the present disclosure obvious with reference to the accompanying drawings.

DETAILED DESCRIPTION OF PREFERRED EMBODIMENTS

Figure 1:
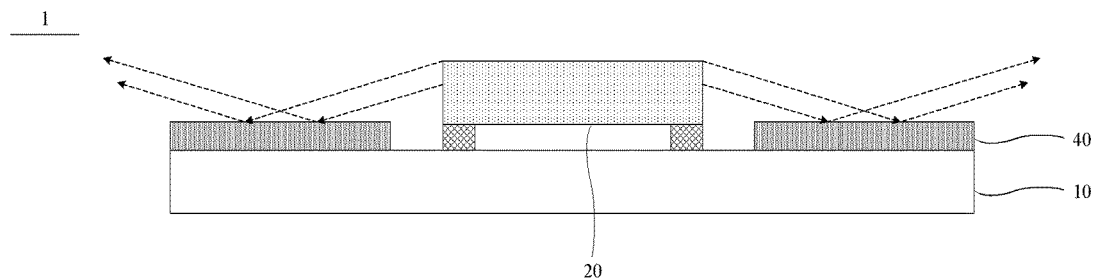
FIG. 1 is a first schematic structural diagram of a light-emitting module in current technology.

The embodiments of the present disclosure provide a light-emitting module and a display device. In order to make the purpose, technical solutions, and effects of the present disclosure clearer and more definite, the following further describes the present disclosure in detail with reference to the drawings and embodiments. It should be understood that the specific embodiments described herein are only used to explain the disclosure and are not used to limit the disclosure.

Referring to FIGS. 3 to 8, an embodiment of the present disclosure provides the light-emitting module and the display device. The light-emitting module 1 includes:
  a backplate 10;
  a plurality of light-emitting units 20 disposed on the backplate 10; and
  a reflective layer 40 disposed on the backplate 10 and including a plurality of reflective units 400, wherein, one of the reflective units 400 surrounds one of the light-emitting units 20, and the reflective units 400 include a reflective surface 400A on one side away from the backplate 10.

In one light-emitting unit 20 and one reflective unit 400 corresponding to the light-emitting unit 20, a height of the reflective surface 400A is gradually increased along a direction away from the light-emitting unit 20.

The reflective unit 400 includes a main body 410 disposed on the backplate 10 and a reflective part 420 disposed on the main body 410. The main body 410 is provided with a retaining wall structure 430 on one side away from the backplate 10. The reflective surface 400A is located on one side of the reflective part 420 away from the main body 410, and an orthographic projection of the reflective part 420 on the backplate 10 covers an orthographic projection of the main body 410 on the backplate 10.

It can be understood that referring to FIG. 1, FIG. 1 is a first schematic structural diagram of a light-emitting module in current technology. A conventional mini-light-emitting diode (mini-LED) light-emitting module 1 usually includes a backplate 10 and a plurality of light-emitting units 20 on the backplate 10. The light-emitting units 20 include but are not limited to mini-light-emitting diodes. In order to improve reflectivity of the light-emitting units 20, a reflective layer 40 is usually disposed on a surface of the backplate 10. The reflective layer 40 is disposed surrounding peripheries of the light-emitting units 20. A material of the reflective layer 40 includes but is not limited to white oil, and reflectivity of reflective units can be improved by the reflection effect of the white oil. However, light is reflected in all directions, and conventional white oil substrate is in a flat state, which will cause partial light laterally emitted from the light-emitting units 20 to have a larger light-emitting angle, thereby being unable to reach the observation surface (that is, having limited light-concentrating effect).

Figure 2:
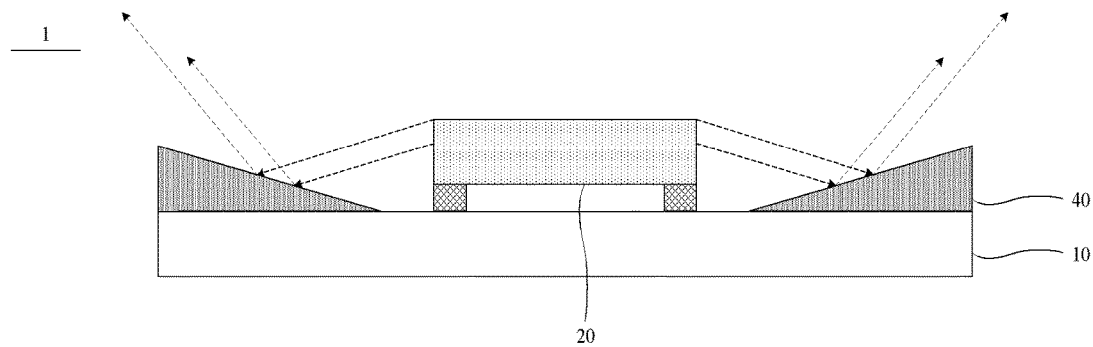
FIG. 2 is a second schematic structural diagram of the light-emitting module in current technology.

In order to solve the above problem, referring to FIG. 2, FIG. 2 is a second schematic structural diagram of the light-emitting module 1 in current technology. The light-emitting module 1 includes a backplate 10 and a plurality of light-emitting units 20 and a reflective layer 40 disposed on the backplate 10. The reflective layer 40 is provided with windows (not marked in the figure), and the light-emitting units 20 are located in the windows. A surface of the windows facing the light-emitting units 20 is an inclined surface relative to the backplate 10, so the reflective layer 40 can effectively reflect the light emitted laterally from the light-emitting units 20 to the light-emitting surface of the light-emitting module 1, thereby improving the light-emitting efficiency. However, the reflective layer 40 usually uses white oil material that has fluidity. Therefore, in practical manufacturing processes, a height of the reflective layer 40 cannot be effectively controlled, thereby causing problems such as difficulty in fabrication processes and inability to effectively reflect the light emitted from lateral sides of the light-emitting units 20 to the light-emitting surface of the light-emitting module 1.

In view of foregoing problems, in the embodiments of the present disclosure, in one light-emitting unit 20 and one reflective unit 400 corresponding to the light-emitting unit 20, a height of the reflective surface 400A is set to gradually increase along the direction away from the light-emitting unit 20. The reflective unit 400 includes the main body 410 disposed on the backplate 10 and the reflective part 420 disposed on the main body 410. The main body 410 is provided with the retaining wall structure 430 on one side away from the backplate 10. The reflective surface 400A is located on one side of the reflective part 420 away from the main body 410, and the orthographic projection of the reflective part 420 on the backplate 10 covers the orthographic projection of the main body 410 on the backplate 10. Therefore, a flow of a material of the reflective part 420 can be effectively blocked and the height of the reflective part 420 can be controlled, thereby further maintaining a height of the reflective surface 400A and allowing the light emitted laterally from the light-emitting units 20 to be effectively reflected to the light-emitting surface of the light-emitting module 1, thereby improving the light-emitting efficiency.

Specific embodiments are used to describe technical solutions of the present disclosure.

Figure 3:
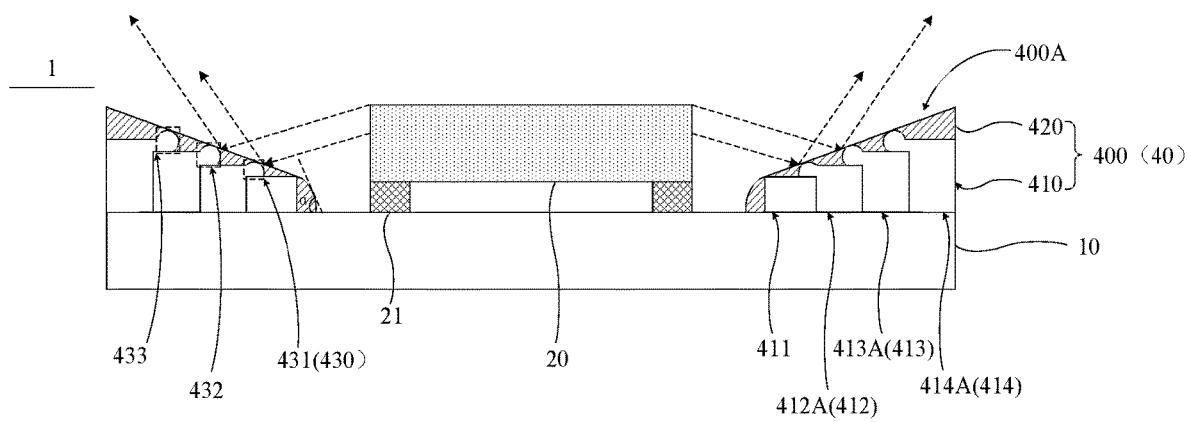
FIG. 3 is a first schematic cross-sectional diagram of a light-emitting module according to an embodiment of the present disclosure.
Figure 4:
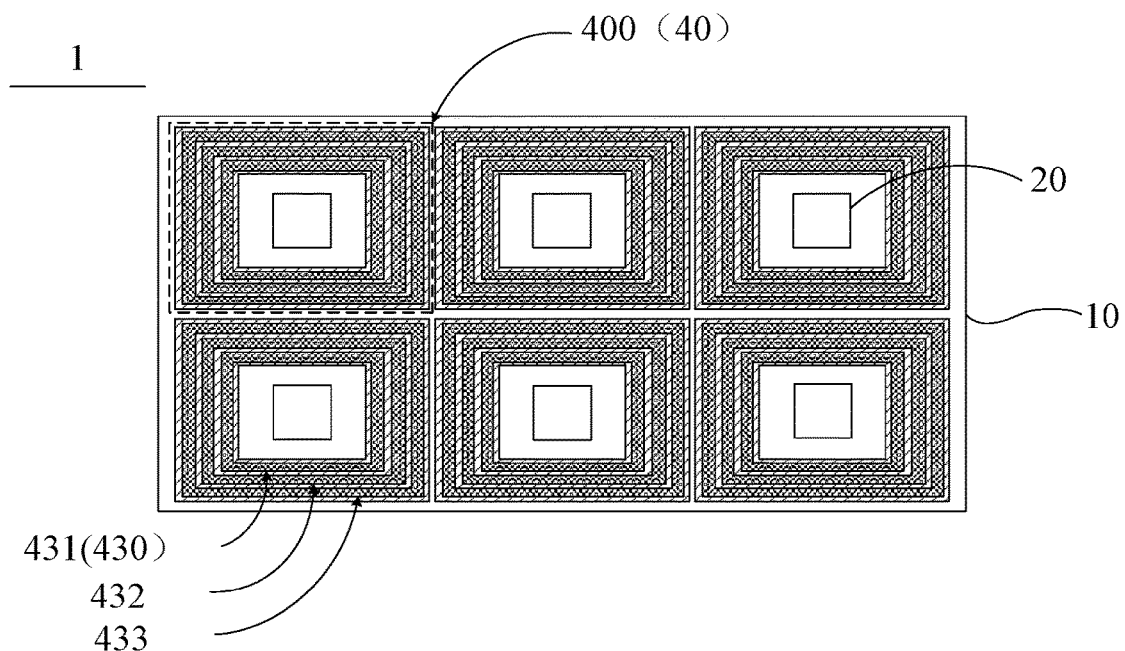
FIG. 4 is a first schematic cross-sectional top view of the light-emitting module according to an embodiment of the present disclosure.

In an embodiment, referring to FIGS. 3 and 4, FIG. 3 is a first schematic cross-sectional diagram of the light-emitting module according to an embodiment of the present disclosure, and FIG. 4 is a first schematic cross-sectional top view of the light-emitting module according to an embodiment of the present disclosure.

This embodiment provides the light-emitting module 1 for providing backlight. The light-emitting module 1 includes the backplate 10 and the plurality of light-emitting units 20 and the reflective layer 40 disposed on the backplate 10.

The backplate 10 includes but is not limited to a circuit board, and the light-emitting units 20 include but are not limited to mini-light-emitting diodes (mini-LEDs), and the backplate 10 is used to provide driving electrical signals for the light-emitting units 20. Each of the light-emitting units 20 includes two electrodes 21 on one side adjacent to the backplate 10, and the backplate 10 includes two bonding pads (not shown in the figures) corresponding to the two electrodes 21 on one side adjacent to the light-emitting units 20. The light-emitting units 20 are welded on the backplate 10 by processes such as reflow soldering, and the electrodes 21 are electrically connected to the bonding pads by solder paste. It should be noted that the backplate 10 being the circuit board and the electrodes 21 being electrically connected to the bonding pads by the solder paste are only taken as an example for description. The type of the backplate 10 and the connection method between the electrodes 21 and the bonding pads are not specifically limited in the embodiments.

The reflective layer 40 includes the plurality of reflective units 400, one of the reflective units 400 surrounds one of the light-emitting units 20, and the reflective units 400 include the reflective surface 400A on one side away from the backplate 10. In one light-emitting unit 20 and one reflective unit 400 corresponding to the light-emitting unit 20, the height of the reflective surface 400A is gradually increased along the direction away from the light-emitting unit 20.

The reflective unit 400 includes the main body 410 disposed on the backplate 10 and the reflective part 420 disposed on the main body 410, the reflective surface 400A is located on one side of the reflective part 420 away from the main body 410, the main body 410 is provided with the retaining wall structure 430 on one side away from the backplate 10, and the orthographic projection of the reflective part 420 on the backplate 10 covers the orthographic projection of the main body 410 on the backplate 10.

In the embodiments, a material of the main body 410 includes but is not limited to transparent photosensitive materials such as photo-spacer (PS) color resists, over-coat resins (OC), and array organic insulating films (polymer film on array, PFA), or other photosensitive materials such as RGB photoresist materials. The reflective part 420 has a reflective effect, which can reflect the light emitted from the light-emitting units 20 toward the backplate 10 to the light-emitting side of the light-emitting module 1, thereby improving the light utilization efficiency. A material of the reflective part 420 includes but is not limited to materials with reflective properties, such as white oil. In this embodiment, after disposing the light-emitting units 20 on the backplate 10, the main body 410 is disposed surrounding the light-emitting unit 20, and then the retaining wall structure 430 is disposed on one side of the main body 410 away from the backplate 10. A layer of white oil is coated on the main body 410 to form the reflective units 400, and a height of the reflective units 400 is less than a height of the light-emitting units 20. That is, in the direction perpendicular to the backplate 10, in one light-emitting unit 20 and one reflective unit 400 corresponding to the light-emitting unit 20, a distance from any point on the reflective layer 40 to the backplate 10 is less than the height of the light-emitting unit 20.

It can be understood that in the embodiments, one reflective unit 400 is set to surround one light-emitting unit 20, and the reflective unit 400 includes the reflective surface 400A on the side away from the backplate 10. In one light-emitting unit 20 and one reflective unit 400 corresponding to the light-emitting unit 20, the height of the reflective surface 400A is gradually increased along the direction away from the light-emitting unit 20. The reflective surface 400A is used to receive the light emitted laterally from the light-emitting unit 20 and effectively reflect the light emitted laterally from the light-emitting units 20 to the light-emitting surface of the light-emitting module 1, thereby improving the light-emitting efficiency. In addition, each of the reflective units 400 is set to include the main body 410 disposed on the backplate 10 and the reflective part 420 disposed on the main body 410. The reflective surface 400A is set to be located on the side of the reflective part 420 away from the main body 410, the main body 410 is set to be provided with the retaining wall structure 430 on the side away from the backplate 10, and the orthographic projection of the reflective part 420 on the backplate 10 is set to cover the orthographic projection of the main body 410 on the backplate 10. The retaining wall structure 430 can effectively block the flow of the material of the reflective part 420, thereby controlling the height of the reflective part 420. Therefore, in practical manufacturing processes, the height of the reflective layer 40 being unable to be effectively controlled can be prevented, thereby preventing the problems such as difficulty in fabrication processes and inability to effectively reflect the light emitted from the lateral sides of the light-emitting units 20 to the light-emitting surface of the light-emitting module 1.

In this embodiment, in the reflective unit 400 and the light-emitting unit 20 corresponding to the reflective unit 400, a height of the main body 410 is gradually increased along the direction away from the light-emitting unit 20. Specifically, the main body 410 includes a plurality of raised parts disposed in sequence away from the light-emitting unit 20, and heights of the raised parts are gradually increased along the direction away from the light-emitting unit 20. Wherein, the raised parts are disposed on the backplate 10 and protrude from a body surface toward the side away from the backplate 10.

It can be understood that in this embodiment, the main body 410 is set to include the plurality of raised parts disposed in sequence away from the light-emitting unit 20, and the heights of the raised parts are set to be gradually increased along the direction away from the light-emitting unit 20, thereby forming the reflective surface 400A on the side of the reflective units 400 away from the backplate 10. Further, the light emitted laterally from the light-emitting unit 20 can be effectively reflected to the light-emitting surface of the light-emitting module 1 by the reflective surface 400A, thereby improving the light-emitting efficiency.

Preferably, the main body 410 at least includes a first raised part 411 and a second raised part 412 disposed in sequence away from the light-emitting unit 20. The second raised part 412 includes a raised main part and the retaining wall structure 430 disposed in a stack, and an orthographic projection of the retaining wall structure 430 in a direction perpendicular to the backplate 10 is within an orthographic projection of the first raised part 411 in the direction perpendicular to the backplate 10. Specifically, in this embodiment, the main body 410 including the first raised part 411, the second raised part 412, a third raised part 413, and a fourth raised part 414 disposed in sequence away from the light-emitting unit 20 is taken as an example for description.

In this embodiment, the first raised part 411, the second raised part 412, the third raised part 413, and the fourth raised part 414 are disposed adjacent to each other in sequence. Wherein, the retaining wall structure 430 includes a first retaining wall 431, a second retaining wall 432, and a third retaining wall 433 disposed around the light-emitting unit 20.

The second raised part 412 includes a first raised main part 412A and the first retaining wall 431 disposed in a stack, the third raised part 413 includes a second raised main part 413A and the second retaining wall 432 disposed in a stack, and the fourth raised part 414 includes a third raised main part 414A and the third retaining wall 433 disposed in a stack. That is, the first raised main part 412A and the first retaining wall 431 are integrally formed, the second raised main part 413A and the second retaining wall 432 are integrally formed, and the third raised main part 414A and the third retaining wall 433 are integrally formed.

Wherein, a height of the third raised main part 414A is greater than a height of the third raised part 413, a height of the second raised main part 413A is greater than a height of the second raised part 412, and a height of the first raised main part 412A is greater than a height of the first raised part 411.

Further, an orthographic projection of the second raised part 412 on the backplate 10 at least partially overlaps an orthographic projection of the first raised part 411 on the backplate 10; an orthographic projection of the third raised part 413 on the backplate 10 at least partially overlaps an orthographic projection of the second raised part 412 on the backplate 10; and an orthographic projection of the fourth raised part 414 on the backplate 10 at least partially overlaps an orthographic projection of the third raised part 413 on the backplate 10. Specifically, an orthographic projection of the first retaining wall 431 in the direction perpendicular to the backplate 10 is within an orthographic projection of the first raised part 411 in the direction perpendicular to the backplate 10; an orthographic projection of the second retaining wall 432 in the direction perpendicular to the backplate 10 is within an orthographic projection of the second raised part 412 in the direction perpendicular to the backplate 10; and an orthographic projection of the third retaining wall 433 in the direction perpendicular to the backplate 10 is within an orthographic projection of the third raised part 413 in the direction perpendicular to the backplate 10.

It should be noted that from common knowledge, it can be known that in color filters, when two adjacent color resists with different colors overlap, a raised portion that looks like a horn will form. Therefore, in this embodiment, using the above principle, the first raised main part 412A is set to overlap the first raised part 411, and the height of the first raised main part 412A is greater than the height of the first raised part 411, thereby forming the first retaining wall 431 at a position where the first raised main part 412A overlaps the first raised part 411. The second raised main part 413A is set to overlap the second raised part 412, and the height of the second raised main part 413A is greater than the height of the second raised part 412, thereby forming the second retaining wall 432 at a position where the second raised main part 413A overlaps the second raised part 412. The third raised main part 414A is set to overlap the third raised part 413, and the height of the third raised main part 414A is greater than the height of the third raised part 413, thereby forming the third retaining wall 433 at a position where the third raised main part 414A overlaps the third raised part 413.

Therefore, in this embodiment, by disposing the first raised part 411, the second raised part 412, the third raised part 413, and the fourth raised part 414 in sequence and making two adjacent raised parts overlap with each other, retaining walls that look like horns can be formed, thereby further saving manufacturing process steps of the light-emitting module 1. Meanwhile, the retaining walls that look like horns can effectively block the flow of the material of the reflective part 420 located on the main body 410, thereby controlling the height of the reflective part 420.

In this embodiment, the height and width of the first raised part 411, the second raised part 412, the third raised part 413, and the fourth raised part 414 are not specifically limited.

Further, in this embodiment, the orthographic projection of the reflective part 420 on the backplate 10 covers the first raised part 411, the second raised part 412, the third raised part 413, and the fourth raised part 414, and an included angle between a tangent line of any point on the reflective surface 400A and the backplate 10 is greater than or equal to 60 degrees. Specifically, the reflective surface 400A includes a first portion (not marked in the figures), and in the direction perpendicular to the backplate 10, a cross-section of the first portion is a straight line or an arc. Preferably, in the direction perpendicular to the backplate 10, the cross-section of the first portion is straight, and the first portion is an inclined plane.

Further, the reflective surface 400A further includes other portions, and in the direction perpendicular to the backplate 10, a cross-section of the other portions may be a straight line or an arc, which is not specifically limited in this embodiment.

It can be understood that an included angle between a tangent line of any point on the first portion and the backplate is greater than or equal to 60 degrees. A size of the included angle α may be controlled by controlling the height of the main body 410, so that the reflective part 420 may have different types of reflective surfaces 400A. In the one reflective unit 400 and the one light-emitting unit 20 corresponding to the reflective unit 400, the reflective surface 400A may cover all or part of a facade of the light-emitting unit 20, thereby further adjusting overall luminous efficiency of the light-emitting module 1.

Figure 5:
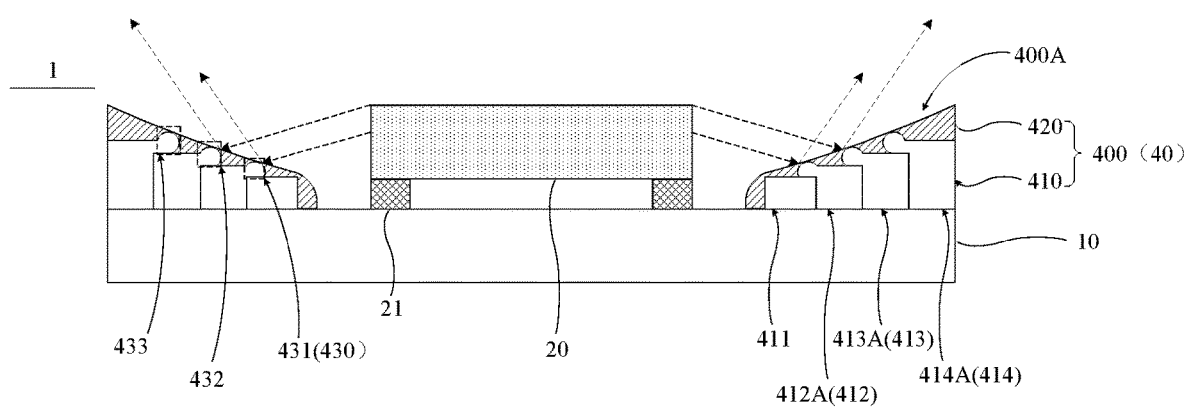
FIG. 5 is a second schematic cross-sectional diagram of the light-emitting module according to an embodiment of the present disclosure.

It should be noted that referring to FIG. 5, FIG. 5 is a second schematic cross-sectional diagram of the light-emitting module according to an embodiment of the present disclosure. In another embodiment, the reflective surface 400A includes the first portion (not marked in the figures), and in the direction perpendicular to the backplate 10, the cross-section of the first portion is a straight line or an arc. Preferably, in the direction perpendicular to the backplate 10, the cross-section of the first portion is arc-shaped, and the first portion is a concave curved surface.

Further, in another embodiment, the included angle between the tangent line of any point on the reflective surface 400A and the backplate is greater than or equal to 60 degrees. Specifically, in the direction perpendicular to the backplate 10, the cross-section of the reflective surface 400A is a straight line or an arc, which is not specifically limited in this embodiment.

In summary, in this embodiment, by disposing the first raised part 411, the second raised part 412, the third raised part 413, and the fourth raised part 414 in sequence and making two adjacent raised parts overlap with each other, the retaining walls that look like horns can be formed, thereby further saving the manufacturing process steps of the light-emitting module 1. Meanwhile, the retaining walls that look like horns can effectively block the flow of the material of the reflective part 420 located on the main body 410, thereby controlling the height of the reflective part 420. In addition, the reflective part 420 may have different types of reflective surfaces 400A by controlling the height of the reflective part 420. In the one reflective unit 400 and the one light-emitting unit 20 corresponding to the reflective unit 400, the reflective surface 400A may cover all or part of the facade of the light-emitting unit 20, thereby further improving the overall luminous efficiency of the light-emitting module 1.

It should be noted that in this embodiment, the reflective units 400 may be disposed at intervals or adjacent to each other, which is not specifically limited herein.

Figure 6:
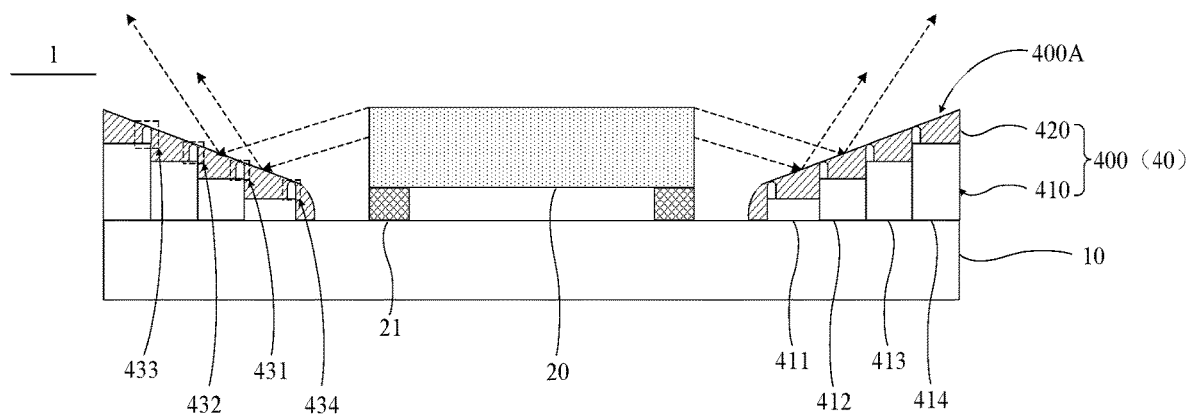
FIG. 6 is a third schematic cross-sectional diagram of the light-emitting module according to an embodiment of the present disclosure.
Figure 7:
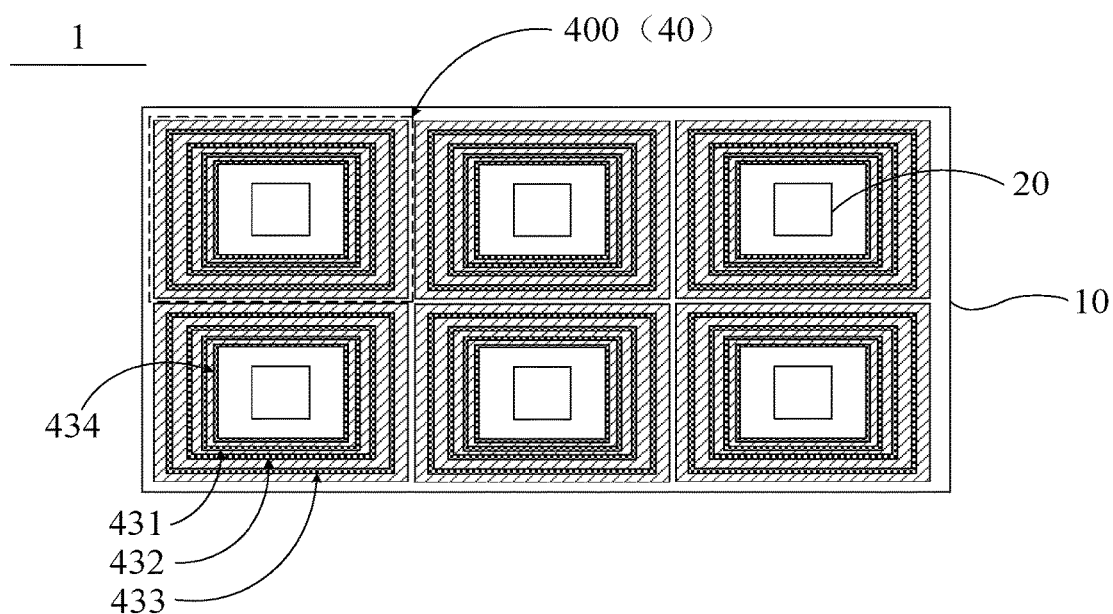
FIG. 7 is a second schematic cross-sectional top view of the light-emitting module according to an embodiment of the present disclosure.

Referring to FIGS. 6 and 7, FIG. 6 is a third schematic cross-sectional diagram of the light-emitting module according to an embodiment of the present disclosure, and FIG. 7 is a second schematic cross-sectional top view of the light-emitting module according to an embodiment of the present disclosure.

In this embodiment, a structure of the light-emitting module 1 is basically similar to or same as that of the light-emitting module 1 provided in the above embodiment, and for details, please refer to the description of the light-emitting module 1 in the above embodiment, which is not repeated herein. An only difference between the two is:

in this embodiment, the main body 410 at least includes the first raised part 411 and the second raised part 412 disposed in sequence away from the light-emitting unit 20, and the orthographic projection of the first raised part 411 on the backplate 10 and the orthographic projection of the second raised part 412 on the backplate 10 do not overlap; and the retaining wall structure 430 is located on one side of the second raised part 412 away from the backplate 10, and the orthographic projection of the retaining wall structure 430 in a direction perpendicular to the backplate 10 is within an orthographic projection of the second raised part 412 in the direction perpendicular to the backplate 10.

Specifically, in this embodiment, the main body 410 including the first raised part 411, the second raised part 412, the third raised part 413, and the fourth raised part 414 disposed in sequence away from the light-emitting unit 20 is taken as an example for description.

In this embodiment, the first raised part 411, the second raised part 412, the third raised part 413, and the fourth raised part 414 are disposed adjacent to each other in sequence. a height of the fourth raised part 414 is greater than a height of the third raised part 413, a height of the third raised part 413 is greater than a height of the second raised part 412, and a height of the second raised part 412 is greater than a height of the first raised part 411. Wherein, the retaining wall structure 430 includes the first retaining wall 431, the second retaining wall 432, and the third retaining wall 433 disposed around the light-emitting unit 20. It should be noted that a material of the retaining wall structure 430 may be same as or different from the material of the main body 410, which is not specifically limited in this embodiment.

Preferably, the first retaining wall 431 is located on one side of the second raised part 412 away from the backplate 10, the second retaining wall 432 is located on one side of the third raised part 413 away from the backplate 10, and the third retaining wall 433 is located on one side of the fourth raised part 414 away from the backplate 10. Specifically, the orthographic projection of the first retaining wall 431 in the direction perpendicular to the backplate 10 is within the orthographic projection of the second raised part 412 in the direction perpendicular to the backplate 10; the orthographic projection of the second retaining wall 432 in the direction perpendicular to the backplate 10 is within the orthographic projection of the third raised part 413 in the direction perpendicular to the backplate 10; and the orthographic projection of the third retaining wall 433 in the direction perpendicular to the backplate 10 is within an orthographic projection of the fourth raised part 414 in the direction perpendicular to the backplate 10. The positions of the first retaining wall 431, the second retaining wall 432, and the third retaining wall 433 are not specifically limited in this embodiment.

It can be understood that in this embodiment, the main body 410 is set to include the first raised part 411, the second raised part 412, the third raised part 413, and the fourth raised part 414 disposed in sequence away from the light-emitting unit 20. The retaining wall structure 430 includes the first retaining wall 431, the second retaining wall 432, and the third retaining wall 433 disposed around the light-emitting unit 20. The first retaining wall 431 is located on the second raised part 412, the second retaining wall 432 is located on the third raised part 413, and the third retaining wall 433 is located on the fourth raised part 414. Therefore, the flow of the material of the reflective part 420 located on the main body 410 can be effectively blocked, thereby controlling the height of the reflective part 420.

In this embodiment, the retaining wall structure 430 further includes a fourth retaining wall 434 disposed around the light-emitting units 20, the fourth retaining wall 434 is located on one side of the first raised part 411 away from the backplate 10, and an orthographic projection of the fourth retaining wall 434 in the direction perpendicular to the backplate 10 is within the orthographic projection of the first raised part 411 in the direction perpendicular to the backplate 10. Compared to the above embodiments, in this embodiment, the first retaining wall 431, the second retaining wall 432, the third retaining wall 433, and the fourth retaining wall 434 are disposed, which can further stop the flow of the material of the reflective part 420 located on the main body 410, thereby controlling the height of the reflective part 420. It can be understood that a number of the retaining walls is not specifically limited in this embodiment.

It should be noted that widths of the first retaining wall 431, the second retaining wall 432, the third retaining wall 433, and the fourth retaining wall 434 are not specifically limited in this embodiment.

Figure 8:
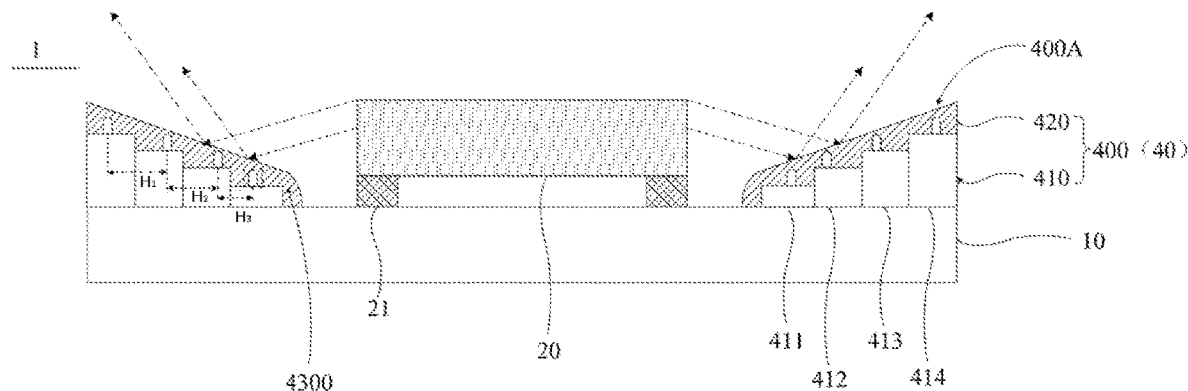
FIG. 8 is a fourth schematic cross-sectional diagram of the light-emitting module according to an embodiment of the present disclosure.

Referring to FIG. 8, FIG. 8 is a fourth schematic cross-sectional diagram of the light-emitting module according to an embodiment of the present disclosure.

In this embodiment, a structure of the light-emitting module 1 is basically similar to or same as that of the light-emitting module 1 provided in the third schematic cross-sectional diagram, and for details, please refer to the description of the light-emitting module 1 in the above embodiment, which is not repeated herein. An only difference between the two is:

in this embodiment, the main body 410 includes a plurality of raised parts disposed in sequence away from the light-emitting unit 20, and heights of the raised parts are gradually increased along the direction away from the light-emitting unit 20. Orthographic projections of adjacent raised parts on the backplate 10 do not overlap. The retaining wall structure 430 includes a plurality of retaining walls 4300, and one of the retaining walls 4300 corresponds to one of the raised parts. Wherein, in the direction perpendicular to the backplate 10, heights of adjacent retaining walls are equal.

Specifically, in this embodiment, the main body 410 including the first raised part 411, the second raised part 412, the third raised part 413, and the fourth raised part 414 disposed in sequence away from the light-emitting unit 20 is taken as an example for description.

In this embodiment, in the direction away from the light-emitting unit 20, gaps between the adjacent retaining walls 4300 are equal or are gradually increased. Preferably, in this embodiment, the gaps between the adjacent retaining walls 4300 are gradually increased, as shown in FIG. 8, $H_1>H_2>H_3$, thereby allowing a slope of the main body 410 to be gentler in the direction away from the light-emitting units 20. Therefore, it can further ensure that the reflective part 420 is gently coated on the main body 410, which prevents the reflective layer 40 from being fractured, thereby being beneficial to improve the product yield.

Figure 9:
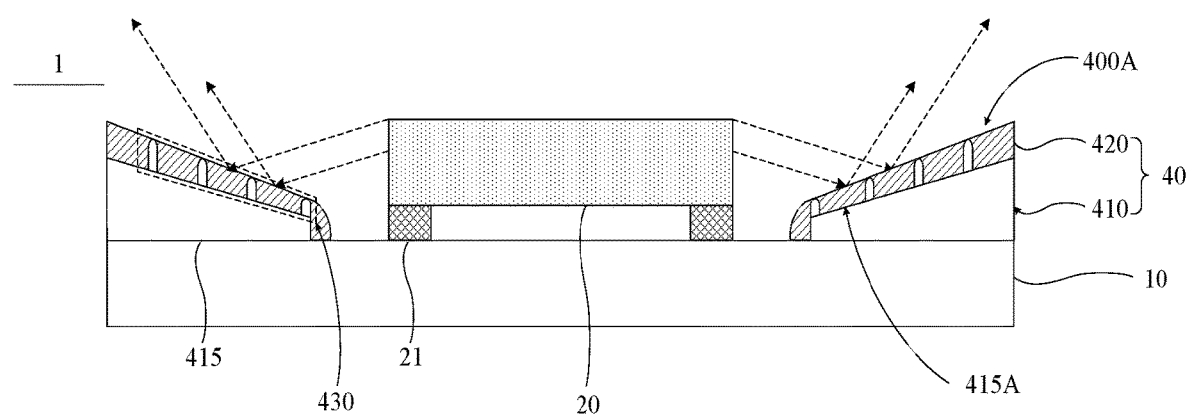
FIG. 9 is a fifth schematic cross-sectional diagram of the light-emitting module according to an embodiment of the present disclosure.

Referring to FIG. 9, FIG. 9 is a fifth schematic cross-sectional diagram of the light-emitting module according to an embodiment of the present disclosure.

In this embodiment, a structure of the light-emitting module 1 is basically similar to or same as that of the light-emitting module 1 provided in the third schematic cross-sectional diagram, and for details, please refer to the description of the light-emitting module 1 in the above embodiment, which is not repeated herein. An only difference between the two is:

in this embodiment, in the reflective unit 400 and the light-emitting unit 20 corresponding to the reflective unit 400, the main body 410 includes a raised part, and the raised part includes a raised beveled surface 415A on one side away from the backplate 10. Wherein, in the reflective unit 400 and the light-emitting unit 20 corresponding to the reflective unit 400, a height of the raised part is gradually increased along the direction away from the light-emitting unit 20, the retaining wall structure 430 includes a plurality of retaining walls disposed on the raised beveled surface 415A and surrounding the light-emitting unit 20, and the retaining walls are arranged in sequence along a direction from the reflective unit 400 to the light-emitting unit 20.

Specifically, in this embodiment, in the reflective unit 400 and the light-emitting unit 20 corresponding to the reflective unit 400, the main body 410 includes a fifth raised part 415, and the fifth raised part 415 includes a raised beveled surface 415A on one side away from the backplate 10. In the reflective unit 400 and the light-emitting unit 20 corresponding to the reflective unit 400, a height of the fifth raised part 415 is gradually increased along the direction away from the light-emitting unit 20, the retaining wall structure 430 includes the plurality of retaining walls disposed on the raised beveled surface 415A and surrounding the light-emitting unit 20, and the retaining walls are arranged in sequence along the direction from the reflective unit 400 to the light-emitting unit 20, which are taken as an example for description.

In this embodiment, in the direction perpendicular to the backplate 10, in any two of the retaining walls, a distance from one of the retaining walls away from the light-emitting unit 20 to the backplate 10 is greater than a distance from another one of the retaining walls adjacent to the light-emitting unit 20 to the backplate 10. Heights of the retaining walls are not specifically limited in this embodiment.

In this embodiment, one reflective unit 400 is disposed to surround one light-emitting unit 20. In the light-emitting unit 20 and the reflective unit 400 corresponding to the light-emitting unit 20, the main body 410 includes the fifth raised part 415, the height of the fifth raised part 415 is gradually increased along the direction away from the light-emitting unit 20, and the fifth raised part 415 includes the raised beveled surface 415A on one side away from the backplate 10, thereby allowing the reflective unit 400 to have the reflective surface 400A on one side away from the backplate 10. Wherein, the retaining wall structure 430 includes the plurality of retaining walls disposed on the raised beveled surface 415A and surrounding the light-emitting unit 20, and the retaining walls are arranged in sequence along the direction from the reflective unit 400 to the light-emitting unit 20. The retaining walls can effectively block the flow of the material of the reflective part 420, thereby controlling the height of the reflective part 420. Therefore, in practical manufacturing processes, the height of the reflective layer 40 being unable to be effectively controlled can be prevented, thereby preventing the problems such as difficulty in fabrication processes and inability to effectively reflect the light emitted from the lateral sides of the light-emitting units 20 to the light-emitting surface of the light-emitting module 1.

It can be understood that compared to the above embodiments, in this embodiment, in the reflective unit 400 and the light-emitting unit 20 corresponding to the reflective unit 400, the main body 410 includes the fifth raised part 415, the height of the fifth raised part 415 is gradually increased along the direction away from the light-emitting unit 20, and the fifth raised part 415 includes the raised beveled surface 415A on one side away from the backplate 10, thereby allowing the reflective unit 400 to have the reflective surface 400A on one side away from the backplate 10. By this setting, this embodiment can save the manufacturing process steps of the light-emitting module 1.

It should be noted that in this embodiment, in the reflective unit 400 and the light-emitting unit 20 corresponding to the reflective unit 400, the fifth raised part 415 may be manufactured on the backplate 10, the fifth raised part 415 is provided with a groove penetrating the main body 410 along the direction perpendicular to the backplate 10, and the light-emitting unit 20 is disposed in the groove. The fifth raised part 415 includes the raised beveled surface 415A on the side away from the backplate 10, and the raised beveled surface 415A is adjacent to the light-emitting unit 20. Wherein, the groove includes a first opening on a side close to the backplate 10 and a second opening on a side away from the backplate 10. A maximum width of the first opening is smaller than a maximum width of the second opening. Then, the retaining walls around the light-emitting unit 20 are prepared on the raised beveled surface 415A, and a layer of white oil is coated onto one side of the fifth raised part 415 away from the backplate 10 to form the reflective unit 400. The height of the reflective unit 400 is less than the height of the light-emitting unit 20.

An embodiment of the present disclosure provides a display device, which includes a display panel and the light-emitting module mentioned in the above embodiments. The display panel includes a display area and a non-display area adjacent to the display area, and the light-emitting module is disposed corresponding to the display area. The reflective layer is disposed on one side of the backplate adjacent to the display panel.

In this embodiment, the display panel is disposed on the light-emitting side of the light-emitting module for displaying images, and the light-emitting module is used for providing backlight to the display panel.

It should be noted that in this embodiment, the display panel includes but is not limited to liquid crystal displays (LCDs), and the light-emitting module may adopt a mini-LED light board as a light source. A size of mini-LEDs is smaller than that of traditional LEDs, and using a huge amount of mini-LEDs as a backlight source can realize finer dynamic control and improve a dynamic contrast ratio of the liquid crystal displays.

It can be understood that the light-emitting module has been described in detail in the above embodiments and is not repeated herein.

In specific applications, the display device may be a display screen of a smart phone, a tablet computer, a notebook computer, a smart bracelet, a smart watch, smart glasses, a smart helmet, a desktop computer, a smart TV, or a digital camera, or may even be applied to electronic devices with flexible display screens.

In summary, the present disclosure provides the light-emitting module and the display device. The light-emitting module includes the backplate and the plurality of light-emitting units and the reflective layer disposed on the backplate. The reflective layer includes the plurality of reflective units, one of the reflective units surrounds one of the light-emitting units, and the reflective units include the reflective surface on one side away from the backplate. In one light-emitting unit and one reflective unit corresponding to the light-emitting unit, the height of the reflective surface is gradually increased along the direction away from the light-emitting unit. The embodiments of the present disclosure dispose the reflective units, which include the main body disposed on the backplate and the reflective part disposed on the main body. One side of the main body away from the backplate includes the retaining wall structure, and the orthographic projection of the reflective part on the backplate covers the orthographic projection of the main body on the backplate, thereby effectively blocking the flow of the material of the reflective part, thereby controlling the height of the reflective part.

The present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. A light-emitting module, comprising:
   a backplate;
   a plurality of light-emitting units disposed on the backplate; and
   a reflective layer disposed on the backplate and comprising a plurality of reflective units, wherein one of the reflective units surrounds one of the light-emitting units, and the reflective units comprise a reflective surface on one side away from the backplate;
   wherein in one light-emitting unit and one reflective unit corresponding to the light-emitting unit, a height of the reflective surface is gradually increased along a direction away from the light-emitting unit; and
   the reflective unit comprises a main body disposed on the backplate and a reflective part disposed on the main body, the reflective surface is located on one side of the reflective part away from the main body, the main body is provided with a retaining wall structure on one side away from the backplate, and an orthographic projection of the reflective part on the backplate covers an orthographic projection of the main body on the backplate;
   wherein in the reflective unit and the light-emitting unit corresponding to the reflective unit, the main body comprises a plurality of raised parts disposed in sequence away from the light-emitting unit, and heights of the raised parts are gradually increased along the direction away from the light-emitting unit.

2. The light-emitting module according to claim 1, wherein the main body at least comprises a first raised part and a second raised part disposed in sequence away from the light-emitting unit; and
   the second raised part comprises a raised main part and the retaining wall structure disposed in a stack, a height of the raised main part is greater than a height of the first raised part, and an orthographic projection of the retaining wall structure in a direction perpendicular to the backplate is within an orthographic projection of the first raised part in the direction perpendicular to the backplate.

3. The light-emitting module according to claim 1, wherein the main body at least comprises a first raised part and a second raised part disposed in sequence away from the light-emitting unit, and an orthographic projection of the first raised part on the backplate and an orthographic projection of the second raised part on the backplate do not overlap; and
   the retaining wall structure is located on one side of the second raised part away from the backplate, and an orthographic projection of the retaining wall structure in a direction perpendicular to the backplate is within an orthographic projection of the second raised part in the direction perpendicular to the backplate.

4. The light-emitting module according to claim 1, wherein orthographic projections of adjacent raised parts on the backplate do not overlap;
   the retaining wall structure comprises a plurality of retaining walls, and one of the retaining walls corresponds to one of the raised parts; and
   in a direction perpendicular to the backplate, heights of adjacent retaining walls are equal.

5. The light-emitting module according to claim 4, wherein in the direction away from the light-emitting unit, gaps between the adjacent retaining walls are equal or are gradually increased.

6. The light-emitting module according to claim 1, wherein an included angle between a tangent line of any point on the reflective surface and the backplate is greater than or equal to 60 degrees.

7. A display device, comprising a display panel and a light-emitting module, wherein the display panel comprises a display area and a non-display area adjacent to the display area, and the light-emitting module is disposed corresponding to the display area and comprises:
   a backplate;
   a plurality of light-emitting units disposed on the backplate; and
   a reflective layer disposed on the backplate and comprising a plurality of reflective units, wherein one of the reflective units surrounds one of the light-emitting units, and the reflective units comprise a reflective surface on one side away from the backplate;
   wherein in one light-emitting unit and one reflective unit corresponding to the light-emitting unit, a height of the reflective surface is gradually increased along a direction away from the light-emitting unit; and the reflective unit comprises a main body disposed on the backplate and a reflective part disposed on the main body, the reflective surface is located on one side of the reflective part away from the main body, the main body is provided with a retaining wall structure on one side away from the backplate, and an orthographic projection of the reflective part on the backplate covers an orthographic projection of the main body on the backplate;

wherein in the reflective unit and the light-emitting unit corresponding to the reflective unit, the main body comprises a plurality of raised parts disposed in sequence away from the light-emitting unit, and heights of the raised parts are gradually increased along the direction away from the light-emitting unit.

8. The display device according to claim 7, wherein the main body at least comprises a first raised part and a second raised part disposed in sequence away from the light-emitting unit; and the second raised part comprises a raised main part and the retaining wall structure disposed in a stack, a height of the raised main part is greater than a height of the first raised part, and an orthographic projection of the retaining wall structure in a direction perpendicular to the backplate is within an orthographic projection of the first raised part in the direction perpendicular to the backplate.

9. The display device according to claim 7, wherein the main body at least comprises a first raised part and a second raised part disposed in sequence away from the light-emitting unit, and an orthographic projection of the first raised part on the backplate and an orthographic projection of the second raised part on the backplate do not overlap; and the retaining wall structure is located on one side of the second raised part away from the backplate, and an orthographic projection of the retaining wall structure in a direction perpendicular to the backplate is within an orthographic projection of the second raised part in the direction perpendicular to the backplate.

10. The display device according to claim 7, wherein orthographic projections of adjacent raised parts on the backplate do not overlap;

the retaining wall structure comprises a plurality of retaining walls, and one of the retaining walls corresponds to one of the raised parts; and in a direction perpendicular to the backplate, heights of adjacent retaining walls are equal.

11. The display device according to claim 10, wherein in the direction away from the light-emitting unit, gaps between the adjacent retaining walls are equal or are gradually increased.

12. The display device according to claim 7, wherein in the reflective unit and the light-emitting unit corresponding to the reflective unit, the main body comprises a raised part, and the raised part comprises a raised beveled surface on one side away from the backplate; and in the reflective unit and the light-emitting unit corresponding to the reflective unit, a height of the raised part is gradually increased along the direction away from the light-emitting unit, the retaining wall structure comprises a plurality of retaining walls disposed on the raised beveled surface and surrounding the light-emitting unit, and the retaining walls are arranged in sequence along a direction from the reflective unit to the light-emitting unit.

13. The display device according to claim 12, wherein in a direction perpendicular to the backplate, in any two of the retaining walls, a distance from one of the retaining walls away from the light-emitting unit to the backplate is greater than a distance from another one of the retaining walls adjacent to the light-emitting unit to the backplate.

14. The display device according to claim 7, wherein an included angle between a tangent line of any point on the reflective surface and the backplate is greater than or equal to 60 degrees.

15. A light-emitting module, comprising:
a backplate;
a plurality of light-emitting units disposed on the backplate; and
a reflective layer disposed on the backplate and comprising a plurality of reflective units, wherein one of the reflective units surrounds one of the light-emitting units, and the reflective units comprise a reflective surface on one side away from the backplate;
wherein in one light-emitting unit and one reflective unit corresponding to the light-emitting unit, a height of the reflective surface is gradually increased along a direction away from the light-emitting unit; and
the reflective unit comprises a main body disposed on the backplate and a reflective part disposed on the main body, the reflective surface is located on one side of the reflective part away from the main body, the main body is provided with a retaining wall structure on one side away from the backplate, and an orthographic projection of the reflective part on the backplate covers an orthographic projection of the main body on the backplate;
wherein in the reflective unit and the light-emitting unit corresponding to the reflective unit, the main body comprises a raised part, and the raised part comprises a raised beveled surface on one side away from the backplate; and
in the reflective unit and the light-emitting unit corresponding to the reflective unit, a height of the raised part is gradually increased along the direction away from the light-emitting unit, the retaining wall structure comprises a plurality of retaining walls disposed on the raised beveled surface and surrounding the light-emitting unit, and the retaining walls are arranged in sequence along a direction from the reflective unit to the light-emitting unit.

16. The light-emitting module according to claim 15, wherein in a direction perpendicular to the backplate, in any two of the retaining walls, a distance from one of the retaining walls away from the light-emitting unit to the backplate is greater than a distance from another one of the retaining walls adjacent to the light-emitting unit to the backplate.

* * * * *